United States Patent [19]

Matrick

[11] Patent Number: 4,965,172

[45] Date of Patent: Oct. 23, 1990

[54] HUMIDITY-RESISTANT PROOFING TONERS WITH LOW MOLECULAR WEIGHT POLYSTYRENE

[75] Inventor: Howard Matrick, Highlands, N.J.

[73] Assignee: E. I. du Pont de Nemours and Company, Wilmington, Del.

[21] Appl. No.: 289,848

[22] Filed: Dec. 22, 1988

[51] Int. Cl.[5] .......................... G03C 5/00; C08F 12/12
[52] U.S. Cl. ..................................... 430/291; 430/110; 430/331; 430/449; 430/965; 526/346; 526/347; 526/347.1
[58] Field of Search ............... 430/291, 331, 965, 449, 430/110, 903; 526/346, 347, 347.1

[56] References Cited

U.S. PATENT DOCUMENTS

| | | |
|---|---|---|
| 2,618,552 | 11/1952 | Wise . |
| 2,638,416 | 5/1953 | Walkup et al. . |
| 2,659,670 | 11/1953 | Copley . |
| 2,788,288 | 4/1957 | Rheinfrank et al. . |
| 2,917,460 | 12/1959 | Solar . |
| 3,080,250 | 3/1963 | Claus . |
| 3,264,244 | 8/1966 | Ambler et al. ................... 526/347 X |
| 3,338,991 | 8/1967 | Insalaco et al. . |
| 3,502,582 | 3/1970 | Clemens et al. . |
| 3,553,133 | 1/1971 | Olson . |
| 3,620,726 | 11/1971 | Chu et al. . |
| 3,965,022 | 6/1976 | Strong et al. . |
| 3,980,575 | 9/1976 | DeRoo et al. . |
| 3,980,576 | 9/1976 | Vijayendran . |
| 4,076,640 | 2/1978 | Forgensi et al. . |
| 4,167,602 | 9/1979 | Serlin . |
| 4,215,193 | 7/1980 | Manger et al. . |
| 4,233,387 | 11/1980 | Mammino et al. . |
| 4,237,257 | 12/1980 | Moriya et al. ................... 526/347 X |
| 4,246,332 | 1/1981 | Tanaka et al. . |
| 4,259,425 | 3/1981 | Serlin et al. . |
| 4,262,648 | 4/1981 | Ziolo et al. . |
| 4,267,247 | 5/1981 | Ziolo et al. . |
| 4,272,184 | 6/1981 | Rezanka . |
| 4,287,287 | 9/1981 | Bolte et al. . |
| 4,294,904 | 10/1981 | Mammino . |
| 4,323,634 | 4/1982 | Jadwin . |
| 4,330,613 | 5/1982 | Fickes . |
| 4,338,391 | 7/1982 | Nacci et al. ....................... 430/39 X |
| 4,355,886 | 10/1982 | Perez et al. . |
| 4,359,516 | 11/1982 | Nacci et al. ....................... 430/39 X |
| 4,369,240 | 1/1983 | Fickes . |
| 4,397,941 | 8/1983 | Fickes . |
| 4,455,360 | 6/1984 | Ishikawa et al. . |
| 4,487,825 | 12/1984 | Gruber et al. . |
| 4,546,072 | 10/1985 | Matrick . |
| 4,565,773 | 1/1986 | Matrick . |
| 4,599,294 | 7/1986 | Matsumoto et al. . |
| 4,603,167 | 7/1986 | Mahalek et al. . |
| 4,661,439 | 4/1987 | Ruskin . |
| 4,737,432 | 4/1988 | Tanaka et al. . |
| 4,840,863 | 6/1987 | Otsu et al. . |

*Primary Examiner*—Paul R. Michl
*Assistant Examiner*—Jeffrey A. Lindeman

[57] ABSTRACT

This invention concerns a method for color development of a surface having imagewise tacky and nontacky image areas which comprises (a) applying a dry nonelectroscopic toner to the image-bearing surface;

(b) distributing the toner particles over the image surface whereby the distributed toner particles become embedded solely in the tacky image areas; and (c) physically removing toner particles from the nontacky areas which are left substantially free of the toner particles, the improvement wherein high resolution images having higher toned optical density with improved color purity are obtained using a dry nonelectroscopic humidity resistant toner having a size distribution within the range from about 0.2 micron to about 10 microns, not more than 10% of the toner being below 0.5 micron and not more than 10% of the toner being above 5 microns, and the toner consists essentially of a colorant dispersed in an organic resin wherein the resin is a single homogeneous polymer selected from the group consisting of homopolymers of styrene or styrene homologs, and interpolymers thereof, said polymer having a number average molecular weight in the range from about 500 to about 2,000 and said polymer having a softening temperature in the range from about 75° C. to about 175° C.

In another embodiment, this invention concerns dry, nonelectroscopic humidity resistant toners for producing high resolution images having higher toned optical density with improved color purity.

15 Claims, No Drawings

HUMIDITY-RESISTANT PROOFING TONERS WITH LOW MOLECULAR WEIGHT POLYSTYRENE

FIELD OF THE INVENTION

This invention relates to dry nonelectroscopic toners and processes of their use. More particularly, this invention relates to dry, nonelectroscopic humidity resistant toners, and their use in toning photosensitive elements having imagewise tacky and complementary nontacky image areas to obtain high resolution images having higher toned optical density with improved color purity.

BACKGROUND OF THE INVENTION

Reproduction processes are known wherein positive-working and negative-working photopolymerizable elements are exposed imagewise through a transparency forming nontacky and tacky image areas. Positive-working photopolymerizable elements are described in Chu and Cohen, U.S. Pat. No. 3,649,268, and negative-working photosensitive elements are described in Chu and Fan, U.S. Pat. Nos. 4,174,216 and 4,191,572. The image is developed by toning with a suitable toner which desirably adheres only in the tacky image areas. Excess toner which may be present is removed from the nontacky image areas to provide, for example, an image which is a proof of the original or which can be used to transfer the image to another surface. Multilayer proofs such as surprint proofs can be made as well. The process for preparation of such proofs is well known in the graphic arts, and is described in detail, for example, in U.S. Pat. Nos. 3,649,268 and 4,174,216, which are hereby incorporated by reference.

Various nonelectroscopic toners and applicators for applying toners have been developed. Typical nonelectroscopic toners are described in Chu and Manger, U.S. Pat. No. 3,620,726, Fickes, U.S. Pat. No. 4,397,941, and Matrick U.S. Pat. Nos. 4,565,773 and 4,546,072. A wide variety of useful resin matrices, such as, polyvinyl chloride, cellulose acetate, cellulose acetate butyrate, polystyrene, and polymethyl methacrylate are mentioned. These resins are polymers which can be characterized by their ability to absorb water. Absorption of water is a function of the polarity of the polymer as well as the substituent groups of the polymer. Examples of polymers having high water absorption characteristics are polyvinyl formal which has basic heteroatoms such as oxygen or nitrogen and nylon 66 which has acidic hydrogen atoms. Water-soluble polymers such as polyvinyl alcohol, polyvinylpyrrolidone and methyl cellulose are not suitable for making toners because these polymers are extremely hygroscopic.

Water absorption of polymers in the form of molded plastics is determined by ASTM D 570. The plastic sample is immersed in water for 24 hours, wiped and the weight increase is measured. The sample has little surface area because it is molded. Accordingly, absorption values are lower than absorption values obtained for particulate toner samples in contact with water vapor. Nevertheless, polymers can be ranked according to their ability to absorb water. The Polymer Handbook, 2d ed., Vol. VIII, pages 5-6 (1975) has a table listing polymers according to their ability to absorb water using the method described above. Those polymers in the highest absorption category (0.8%-1.7%) consisted of cellulose derivatives, polyamides with no more than six carbon atoms and polyacetals. The second highest category (0.08%-0.4%) contained polymers such as poly(oxymethylene), poly(methyl methacrylate), melamine and acrylonitrile polymers. Those polymers having the lowest absorption (<0.08%) contained polyolefins and copolymers of polyolefins, polystyrenes and halogenated polymers.

It has been found that the toned density of a proof is variable when the toner is not humidity resistant. The toning process then becomes dependent upon the relative humidity of the area in which toning is taking place. Proof-to-proof uniformity is degraded as well as the overall reliability of the system. The dry, nonelectroscopic toners described in the examples of Chu, Fickes and Matrick contain a resin (i.e., cellulose acetate) which is not humidity resistant. The moisture retaining capacity of cellulose acetate is such that the toned density of the resulting proof varies depending upon the humidity of the surrounding environment.

While automatic toning machines have improved the uniformity and consistency of short-term proof-to-proof toning density, it has been found that the flow of toner through the toning apparatus is impeded because the toner is not humidity resistant. The toner particles absorb moisture, aggregate and clog the nozzles of the toning apparatus. Consequently, the desired toned density cannot be achieved. These factors increase the need for toners which perform uniformly and reproducibly over time.

Proofing colors obtained using nonelectroscopic toners also should have improved color purity/decreased grayness. This upgrades the ability of the proofing system to match four color process printing.

Furthermore, it is important that the toner particles have small particle size because smaller particle size allows for higher resolution thereby increasing the potential toning scale. Current proofing systems want to achieve higher resolutions in order to obtain more accurate proofs.

Thus, there is a need for a dry, nonelectroscopic humidity resistant toner for producing high resolution images having higher toned optical density with improved color purity.

SUMMARY OF THE INVENTION

This invention concerns a method for color development of a surface having imagewise tacky and nontacky image areas which comprises (a) applying a dry nonelectroscopic toner to the image-bearing surface;

(b) distributing the toner particles over the image surface whereby the distributed toner particles become embedded solely in the tacky image areas; and (c) physically removing toner particles from the nontacky areas which are left substantially free of the toner particles, the improvement wherein high resolution images having higher toned optical density with improved color purity are obtained using a dry nonelectroscopic humidity resistant toner having a size distribution within the range from about 0.2 micron to about 10 microns, not more than 10% of the toner being below 0.5 micron and not more than 10% of the toner being above 5 microns, and the toner consists essentially of a colorant dispersed in an organic resin wherein the resin is a single homogeneous polymer selected from the group consisting of homopolymers of styrene or styrene homologs, and interpolymers thereof, said polymer having a number average molecular weight in the range from about 500 to about 2,000, and said polymer having a softening temperature in the range from about 75° C. to about 175° C.

In another embodiment, this invention concerns dry, nonelectroscopic humidity resistant toners for producing high resolution images having higher toned optical density with improved color purity.

DETAILED DESCRIPTION OF THE INVENTION

The dry nonelectroscopic toners of this invention have a size distribution within the range from about 0.2 to about 5 microns, not more than 10% of the toner particles being below 0.5 micron and not more than 10% of the toner particles being above 5 microns. The term "particle size" as used herein with respect to the toners refers to the size distribution of the smallest independently acting unit which is capable of differentiating between the tacky and nontacky areas of the photoimaged element.

The term "nonelectroscopic" means that the toners are neither repelled from nor attracted to a charged rod when placed in close proximity to the particles.

The nonelectroscopic toners of the invention are humidity resistant. The term "humidity resistant" as used herein means that resins used to formulate the toners of this invention absorb little or no moisture from the surrounding environment in which toning takes place. Preferably, the toners of this invention should not absorb more than 0.5% water as measured by the moisture absorption test described below.

Use of the toners described herein to tone photosensitive elements having imagewise tacky and nontacky image areas makes it possible to obtain high resolution proofs having higher toned optical density with improved color purity. In addition, these toners are relatively inexpensive to produce.

Organic resins suitable for making the toners of this invention include low molecular weight homopolymers of styrene or styrene homologs and interpolymers thereof wherein the resins have a number average molecular weight in the range from about 500 to about 2,000 and, most preferably, in the range from about 600 to about 1,000. In addition, the softening temperature of the resin is in the range from about 75° C. to about 175° C. and, most preferably, in the range from about 90° C. to about 150° C.

Softening temperature is determined according to the procedure described below.

Examples of low molecular weight homopolymers of styrene homologs which can be used to practice the invention include alpha-methylstyrene and vinyl toluene. Also useful are related compounds such as vinyl naphthalene, and halogenated styrenes, such as, p-chlorostyrene. The most preferred styrene homolog is a low molecular weight linear homopolymer of alpha-methylstyrene which can be purchased from the Amoco Chemical Co. (Chicago, IL) under the trade names Amoco® Resin 18-210, Resin 18-240, and Resin 18-290. Resin 18-210 has a number average molecular weight of about 685 and a softening point in the range from about 90° C. to about 105° C. (200–°220° F). Resin 18-240 has a number average molecular weight of about 790 and a softening point in the range from about 110° C. to about 125° C. (235–255° F). Resin 18-290 has a number average molecular weight of about 960 and a softening point in the range from about 135° C. to about 150° C. (280°–300° F.).

Although various types of antistatic agents are known for treating and coating the toner surface, some of these agents are not humidity resistant. Antistatic agents which are useful to treat the surface of the toners of this invention should be substantially humidity resistant. The preferred antistatic agents are nonionic. There can be mentioned amphipathic agents which are commonly used as surface active agents. These amphipathic agents contain polyoxyalkylene as the polar moiety and fluorocarbons, polysiloxanes or hydrocarbons as the nonpolar moiety. It is believed that the presence of an antistatic agent and a slip agent on the toner surface act in concert to prevent the toner particles from adhering to nontacky areas.

The antistatic agent prevents an electrostatic charge from either accumulating or being maintained so that electrostatic attraction between the toners and nontacky areas are minimized or substantially eliminated. Simultaneously, working in conjunction with the antistatic agent, a slip agent prevents the toner particles from adhering to the nontacky areas by minimizing or preventing frictional forces or embedding of the particles. The slip agent favors the "skidding" of the toner particles over the nontacky surface and facilitates their removal while mechanical action, e.g., rubbing is applied to the toners to embed them in the tacky image areas. In effect, the two additives working in cooperation substantially improve the differentiation of particles between the tacky and nontacky areas of the photosensitive element. The toners thus adhere to the tacky image areas but do not adhere to the nontacky areas. The lower propensity of the toners to stain nontacky areas and the ease with which the toners can be removed from such areas is largely attributed to the presence on the surface of the toner particles of the combination of at least about 0.5% to about 40% by weight of an antistatic agent and at least about 0.1% to about 25% by weight of a slip agent. Preferably, the amount of slip agent coated on the toner surface is in the range from about 0.3% to about 15% by weight.

The preferred antistatic agents for treating the surface of the toners of this invention include the antistatic agents described in Matrick, U. S. Pat. No. 4,565,773 and those described in Applicant's Assignee's, E.I. du Pont de Nemours and Company's copending patent application having U.S. Ser. No. 07/086,018 which was filed on Aug. 14, 1987. The disclosures of which are hereby incorporated by reference. The antistatic agents described in U.S. Pat. No. 4,565,773 are nonionic siloxaneoxyalkylene copolymers. The antistatic agents described in the copending application referenced above are organofunctional substituted fluorocarbon compounds having a volatility such that, under normal atmospheric conditions, the boiling point is greater than 300° F., and (1) having a general formula R(f)QA, wherein R(f) is a perfluoroalkyl group, $C_nF(2n+1)$, where n is from 4 to 20;

Q is a divalent bridging group capable of connecting the R(f) group with the A group, Q being an alkylene /oxy group, $(-CH_2-)_xO-$, or an alkylene group, $(-CH_2)_x$, where x is from 2 to 6; a sulfonamido group, $-SO_2N(R_1)-$; or a sulfonamido/alkylene group, $-SO_2N(R_1)(CH_2)_x-$, where $R_1$ is $C_1$ to $C_6$ alkyl and x is from 2 to 6; and A is the terminal group, A being H when Q is sulfonamido, $-(R_2O)_mR_3$ where $R_2$ is an alkylene group of 2 to 6 carbons or mixtures thereof, and $R_3$ is H or $C_1$ to $C_4$ alkyl, and m is 1 to 22, or A is an acrylate group, $-OOCC(R_4)=CH_2$ where $R_4$ is H, $-CH_3$, or $-C_2H_5$; or (2) being a fluoroaliphatic polymeric ester.

Most of the organofunctional substituted fluorocarbon compounds exist as liquids in the temperature range at which they are applied to the toner particles. Preferred compounds of the invention exist as liquids having a viscosity of less than 5,000 cs. in such a temperature range.

More specifically, suitable organofunctional substituted fluorocarbon compounds, and more preferably, neat organofunctional substituted fluorocarbon liquids, are selected from one of the following groups, consisting of:

a. $C_nF_{(2n+1)}SO_2N(R_1)(R_2O)_mR_3$, where
  n is 4 to 20,
  m is 0 to 22,
  $R_2$ is alkylene of 2 to 6 carbons or mixtures thereof,
  $R_2$ and $R_3$ are independently H or $C_1$ to $C_6$ alkyl, provided that when m is 0, $R_3$ is H.

b. $C_nF_{(2n+1)}SO_2NR_1R_5$, where
  n is 4 to 20,
  $R_1$ is $C_1$ to $C_6$ alkyl,
  $R_5$ is an acrylate, $-OOCC(R_4)=CH_2$, where $R_4$ is H, $CH_3$, or $C_2H_5$.

c. $C_nF_{(2n+1)}SO_2N(R_1)(R_2O)_m-R_3$, where
  n is 6 to 8, preferably 6.5 to 7.5,
  $R_1$ is $C_2H_5$,
  $R_2$ is $-CH_2CH_2$
  m is 0 or 6 to 8, preferably, m is 7,
  $R_3$ is H or $CH_3$, and provided that m is 0 when $R_3$ is H.

d. $C_nF_{(2n+1)}SO_2N(R_1)(R_5)$, where
  n is 6 to 8, preferably 6.5 to 7.5,
  $R_1$ is $C_1$ to $C_6$ alkyl,
  $R_5$ is an acrylate, $-OOCC(R_4)=CH_2$, where $R_4$ is H, $CH_3$, or $C_2H_5$.

e. $C_nF_{(2n+1)}-R_2O-(R_2O)_m-R_3$, where
  n is 4 to 20,
  m is 5 to 13,
  $R_2$ is an alkylene of 2 to 6 carbons, or mixtures thereof,
  $R_3$ is H or $C_1$ to $C_4$ alkyl.

f. $C_nF_{(2n+1)}-CH_2CH_2O-(CH_2CH_2O)_m-R_3$, where
  n is 4 to 20,
  m is 5 to 13,
  $R_3$ is H or C; to $C_4$ alkyl.

g. $C_nF_{(2n+1)}-CH_2CH_2O-(CH_2CH_2O)_m-R_3$, where
  n is 6 to 8, preferably 7.3,
  m is 6 to 8, preferably 7.3,
  $R_3$ is H or $C_1$ to $C_4$ alkyl.

h. $C_nF_{(2n+1)}(CH_2)_xR_5$, where
  n is 4 to 20,
  x is 2 to 6,
  $R_5$ is $-OOCC(R_4)=CH_2$, where $R_4$ is H, $CH_3$, or $C_2H_5$.

i. $C_nF_{(2n+1)}(CH_2)_xR_5$, where
  n is 6 to 8, preferably 7.3,
  x is 2 to 6,
  $R_5$ is $-OOCC(R_4)=CH_2$ where $R_4$ is H, $CH_3$, or $C_2H_5$.

j. Fluoroaliphatic polymeric esters.

The preferred organofunctional substituted fluorocarbon liquids should have the following properties:

1. Be a neat liquid at the temperature at which it is applied to the toner particles, preferably at temperatures of 20°-30° C. The compound should melt at below 100° C., preferably below 50° C.

2. Have sufficiently low viscosity so that the fluorinated liquid can be easily delivered and applied to the toner particles, and be capable of becoming uniformly distributed on the surface of the toner particles. The viscosity of the liquid should be less than 5000 cs., preferably less than 1000 cs., and more preferably less than 300 cs. The compounds of the invention are nonionic, a property which is important because it permits the compounds to exist in the form of low viscosity liquids in the preferred temperature range.

3. Have sufficiently low volatility so the treatment remains on the toner particles over the life of the toner. This means that generally the liquid should have a boiling point of greater than 300° F. (149° C.).

Various types of known organofunctional substituted fluorocarbon compounds may be used for treating and coating the particulate toner surface. Useful compounds include:

| FLUORINATED COMPOUND | BP (°C.) | MP (°C.) | VISCOSITY (cs) | SP. GR. | REF. INDEX |
|---|---|---|---|---|---|
| FLUORAD ® FC171 | >149 | −6 | 130 | 1.4 | 1.398 |
| FLUORAD ® FX189 | >149 | −10 to −25 | 100 | 1.5 | 1.381 |
| FLUORAD ® FC430 | >149 | −25 | 3043 | 1.15 | 1.445 |
| FLUORAD ® FX12 | 110* | 80 to 90 | SOLID AT RT | 1.6 | — |
| ZONYL ® FSO 100 | 200 | 50 | 18.4 at 55° C. | 1.36 | — |
| MEGAFAC ® FC-141 | | | | | |
| FLUOWET ® OT | 160 | | 121 | 1.4 | |
| MPD6931 | 100 TO 200 | 30 TO 40 | SEMI-SOLID AT RT | 1.6 | |
| LODYNE ® S-107B | 90 TO 96 | — | — | 1.06 | |
| SURFLON ®-145 | — | — | — | 1.03 | |

*at 2 mm Hg.

"Fluorad" is the registered trademark of 3M Co., Minneapolis, MN.
"Zonyl" is the registered trademark of E. I. du Pont de Nemours and Company, Wilmington, DE.
"Megafac" is the registered trademark of Asahi Glass, Tokyo, Japan.
"Fluowet" is the registered trademark of American Hoechst, Somerville, NJ.
MPD6931 is manufactured by E. I. du Pont de Nemours and Company, Wilmington, DE.
"Lodyne" is the registered trademark of Ciba-Geigy, Ardsley, NY.
"Surflon" is the registered trademark of DiaNippon Ink, Tokyo, Japan.
NOTE: LODYNE ® and SURFLON ® are not neat liquids, but are purchased dissolved in an appropriate solvent. After application of the commercial liquid, the solvent dries leaving the fluorinated compound on the surface of the toner particles. The data provided above represent the compounds in isopropanol/water and isopropanol/water/dioxane solvents, respectively.

One or more fluorinated liquids can be mixed together prior to application as long as they form a single phase liquid, or more than one compound may be dissolved in an organic solvent or mixture of solvents.

Slip agents which are useful for treating and coating the toner surface in cooperation with the above described antistatic agents are selected from the group consisting of silicone oil having a weight average molecular weight of about 200 to 10,000; and fluorocarbon compounds having a weight average molecular weight of 500 to 500,000.

Useful silicone oils include: poly dimethylsiloxane and polymethyl (X) siloxane wherein X is an alkyl chain with 2 to 12 carbon atoms, e.g., ethyl to dodecyl.

Saturated hydrocarbons include: motor lubricating oil, SAE 10, paraffin oil viscosity at 55° C. is 70 cps using a Brookfield Viscometer manufactured by Brookfield Engineering Lab, Inc., (Stoughton, Mass.); paraffin wax ranging in chain length from 20 to 34 carbon atoms; and polyethylene waxes having a molecular weight in the range of 1500 to 10,000.

Fluorinated hydrocarbons include: fluorocarbon oil, e.g., a polymer of $(CF_2CFCl)_x$ wherein X is 6 to 10, average molecular weight 965, viscosity at 38° C. is 2740 cp, viscosity at 71° C. is 160 cp; pour point is 21° C., and polytetrafluoroethylene compound from the formula $(CF_2—CF_2)_x$ wherein X is a number of 6 to 10.

Silicone oil is the preferred slip agent. The slip agent when a liquid at normal room temperature is a nonsolvent for the toner, is nonvolatile, and is stable to serial oxidation.

As the colorant there can be mentioned any of the pigments listed in the following Table. It should be understood that this list is simply illustrative and is not to be construed as limitation.

TABLE 1

| Pigment Brand Name | Manufacturer | Coulour Index Pigment |
|---|---|---|
| Permanent Yellow DHG | Hoechst | Yellow 12 |
| Permanent Yellow GR | Hoechst | Yellow 13 |
| Permanent Yellow G | Hoechst | Yellow 14 |
| Permanent Yellow NCG-71 | Hoechst | Yellow 16 |
| Permanent Yellow GG | Hoechst | Yellow 17 |
| Hansa Yellow RA | Hoechst | Yellow 73 |
| Hansa Brilliant Yellow 5GX-02 | Hoechst | Yellow 74 |
| Dalamar ® Yellow YT-858-D | Heubach | Yellow 74 |
| Hansa Yellow X | Hoechst | Yellow 75 |
| Novoperm ® Yellow HR | Hoechst | Yellow 83 |
| Cromophtal ® Yellow 3G | Ciba-Geigy | Yellow 93 |
| Cromophtal ® Yellow GR | Ciba-Geigy | Yellow 95 |
| Novoperm ® Yellow FGL | Hoechst | Yellow 97 |
| Hansa Brilliant Yellow IOGX | Hoechst | Yellow 98 |
| Lumogen ® Light Yellow | BASF | Yellow 110 |
| Permanent Yellow G3R-01 | Hoechst | Yellow 114 |
| Cromophthal ® Yellow 8G | Ciba-Geigy | Yellow 128 |
| Irgazine ® Yellow 5GT | Ciba-Geigy | Yellow 129 |
| Hostaperm ® Yellow H4G | Hoechst | Yellow 151 |
| Hostaperm ® Yellow H3G | Hoechst | Yellow 154 |
| Hostaperm ® Orange GR | Hoechst | Orange 43 |
| Paliogen ® Orange | BASF | Orange 51 |
| Irgalite ® Rubine 4BL | Ciba-Geigy | Red 57:1 |
| Quindo ® Magenta | Mobay | Red 122 |
| Indofast ® Brilliant Scarlet | Mobay | Red 123 |
| Hostaperm ® Scarlet GO | Hoechst | Red 168 |
| Permanent Rubine F6B | Hoechst | Red 184 |
| Monastral ® Magenta | Ciba-Geigy | Red 202 |
| Monastral ® Scarlet | Ciba-Geigy | Red 207 |
| Heliogen ® Blue L 6901F | BASF | Blue 15:2 |
| Heliogen ® Blue K 7090 | BASF | Blue 15:3 |
| Heliogen ® Blue L 7101F | BASF | Blue 15:4 |
| Paliogen ® Blue L 6470 | BASF | Blue 60 |
| Heliogen ® Green K 8683 | BASF | Green 7 |
| Heliogen ® Green L 9140 | BASF | Green 36 |
| Monastral ® Violet R | Ciba-Geigy | Violet 19 |
| Monastral ® Red B | Ciba-Geigy | Violet 19 |
| Indofast ® Violet | Mobay | Violet 23 |
| Monastral ® Violet Maroon B | Ciba-Geigy | Violet 42 |
| Sterling ® NS Black | Cabot | Black 7 |
| Tipure ® R-101 | Du Pont | |

The colorant can be present in an amount ranging from about 0.5% to about 70% by weight based on the weight of the untreated toner.

The toner particles can be readily made as discussed in the Examples. For the purpose of determining whether such a particles has the preferred particle size distribution these particles can be measured, for example, by a Coulter Counter (Coulter Electronics, Inc., Hialeah, Fla.), or by a Microtrac ® Particle Analyzer (Leeds and Northrup Instruments, North Wales, Pa.). The preferred instrument is a Microtrac ® Particle Analyzer. Unless otherwise indicated, all particle sizes discussed herein are as determined by a Microtrac ® Particle Analyzer.

The antistatic agent and slip agent can be coated in either order or simultaneously on the surface of the toner particles. This is generally accomplished in a Patterson Kelley Twin Shell Blender manufactured by Patterson Kelley Co., Division of Harsco Corp., East Stroudsburg, Pa. or a Red Devil #30, 5400 paint conditioner Model MKI—R, Red Devil, Inc., Union, N.J. Other comparable milling devices can be used . The milling is for at least 5 minutes up to 30 minutes or longer. After milling, if necessary, the particles are permitted to dry or can be dried as is known to those skilled in the art.

The toners are useful for color development of a surface having imagewise tacky and nontacky areas wherein toners of the type described above are applied to the image—bearing surface, and the toner particles are distributed over the image surface whereby the toner particles become embedded solely in the tacky image areas. The remaining toner particles are physically removed, e.g., by wiping with a suitable cloth or clean—up section of a toning apparatus if one is used. The nontacky areas are left substantially free of the toner particles. The tacky surface is present in:

(a) a photopolymerizable layer (positive-working wherein the exposed areas become photohardened) (Chu and Cohen, U.S. Pat. No. 3,649,268);

(b) an imagewise exposed photosensitive layer comprising at least one thermoplastic binder and a photosensitive system, consisting essentially of (I) at least one dihydropyridine compound of the formula

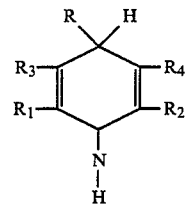

wherein

R is alkyl, alkenyl of 3 to 11 carbon atoms, phenylalkyl, phenylalkenyl, unsubstituted aryl of 6 to 10 carbon atoms, and heteroaryl, $R_1$ and $R_2$, which can be the same or different, are alkyl, and $R_3$ and $R_4$, which can be the same or different, are COOR', COR', CN, R' is alkyl; and II. at least one hexaarylbiimidazole compound, (negative-working wherein the exposed areas are tacky) (Abele and Grossa U.S. Pat. No. 4,243,741);

(c) an imagewise exposed element containing nontonable image areas and tacky nonphotosensitive image areas (also negative-working element) (Cohen and Fan U.S. Pat. No. 4,174,216). These patents are incorporated herein by reference.

Other systems known to those skilled in the art can be used provided that tacky and nontacky image areas are formed thereby. The tacky and nontacky image areas in these systems can be formed either directly, e.g., by exposure to actinic radiation or by treatment with solutions, heat or other means to obtain tacky image areas.

Surprint multicolor proofs can be made by laminating at least one other tonable photoimagable layer over the previously imagewise toned layer. Each tonable layer is exposed through a different color separation transparency, and the respective layer is colored or developed with toners in a spectral region corresponding to the color separation transparency used for exposure. In most cases four photoimaged toned elements are present in a surprint proof, the toned elements and separation transparencies corresponding respectively to yellow, magenta, cyan and black.

A particularly preferred process involves automatic color development of a surface having imagewise tacky and nontacky areas by dispensing and embedding dry particulate toners on the surface by means of an automatic toning apparatus having a dispenser for dispensing said toner above said surface, and an applicator for embedding said particulate toners in said surface, and means for moving the tacky surface past the dispenser and said applicator, the dispenser includes a hopper having an independently movable side wall, and means to oscillate the side wall laterally of the tacky surface, thereby to supply the particulate material to the surface at a uniform, controlled rate, the improvement wherein the new dry, nonelectroscopic toners described above are automatically dispensed, embedded, and the excess removed from the nontacky areas. Alternatively, the dispenser may comprise a stationary hopper and two sets of fingers oscillating out of phase with each other, preferably 90° out of phase with each other.

EXAMPLES

This invention is illustrated by the following examples wherein the percentages are by weight.

Number average molecular weight can be determined by known osmometry techniques. Weight average molecular weight can be determined by using conventional light scattering techniques.

Softening points were determined by a ball and ring apparatus as described in ASTM E 28-67 which is found in the 1982 Annual Book of ASTM Standards, ASTM, Philadelphia, Pa., Part 41, pages 43-49. A disc of the sample was held within the ring and a steel ball was placed on the sample. Softening point is the temperature at which the sample was displaced downward by 1 inch (2.54 cm).

Moisture absorption measurements (i.e., humidity resistance) were made using the following procedure:

Toner samples were stored for at least 66 hours at 90% relative humidity and 20°-25° C. in a closed container over a solution of 50 parts by weight of Zinc Sulfate Heptahydrate and 50 parts of water. Water content was determined on a Du Pont 1090 Thermal Analyser (TGA),(E. I. du Pont de Nemours and Co., Wilmington, Del.). A 20 milligram sample was warmed at 50° C. per minute until 110° C. was reached. The sample was held at 110° C. for 10 minutes. Moisture content was assumed to be equivalent to total weight loss. Data is given in Table 2

CONTROL 1

The following ingredients were used to prepare a cyan toner:

| INGREDIENT | AMOUNT (g) |
| --- | --- |
| Heliogen ® Blue L 7101 F, (BASF Corp., Holland, MI 49423) | 1,728.0 |
| Cellulose acetate | 7,871.0 |
| Acetone | 27,669.6 |
| Water | 22,680.6 |

Water and acetone were thoroughly mixed and were charged to a Type 30—S Attritor stirred and jacketed ball mill (Union Process Co., Akron, Ohio). This mill contained 0.1875 inch (0.049 cm) Type 440 stainless steel balls that were agitated at 150 rpm. A nitrogen atmosphere was maintained in the mill during the mixing procedure. Approximately two-thirds of the weight of the cellulose acetate was then added over a 3- to 5-minute period. The mixture was agitated in the liquid for about 2 minutes. Pigment was added over a 2-minute period followed by addition of the remaining amount of cellulose acetate. The mixture was then agitated at about 150 rpm in the mill for about 6 hours at 22° C.; 5 gallons of water were added in 2 minutes followed by agitation for 5 minutes. The mill was drained and washed with water and the combined effluents were filtered to collect the wet toner. The wet toner was water-washed and dried in an oven at 115°-125° C., and the dried toner was pulverized in a pin mill. The particle size of the resulting toner was determined on a Microtrac ® Particle Analyzer (Leeds and Northrup Instruments, North Wales, Pa. 19454). (Unless otherwise indicated, particle sizes are in microns.)

| Percentile | Paticle Size (microns) |
| --- | --- |
| 10% | 1.13 |
| 50% | 3.11 |
| 90% | 7.44 |

The 50th percentile is the average particle size by population count and is deemed equivalent to "particle size". The 90 percentile signifies that 10% of the particles are greater than this size. The sizes of the particles between 10% and 90% are an indication of the range of particle size. A narrow range of particle size is desirable, so that the 10-90% range should be minimized.

The particle size is determined by the particle breakage which occurs in a jet mill as high velocity air forces toner particles to abrade. Efficient particle size reduction is directly related to the brittleness of the toner resin. Brittleness is the opposite of both elasticity and high impact strength or toughness. Small particle size is the result of the high degree of brittleness of the resins used to make the toners of this invention. The brittleness is a function of the low molecular weight and the particular polymer selected which in this case was a styrene-containing polymer.

It is desirable that the toners of this invention have a particle size distribution in the range from about 0.2 micron to about 10 microns, not more than 10% of the toner particles being below 0.5 micron and not more than 10% of the toner particles being above 5 microns.

CONTROL 2

A cyan toner was prepared as described above for Control 1. It was treated as follows: 24 g (8%) of 200 fluid, 100 cs, (Dow Corning Co. Midland, Mich.), an 8 inch (20.32 cm) stainless steel chain and 300 g of the untreated toner (Control 1) were added to a two-quart Bain Marie container (LeBeau Products, Baraboo, Wis.). After stirring with a spatula, the mixture was blended 30 minutes on a Red Devil Paint Conditioner, Model MKI-R (Red Devil, Inc., Union, N.J.). 75 grams of a 20% solution of Merquat ® 100 (Calgon Corp., Teterboro, N.J.) were added to the mixture which was then blended for another 30 minutes and dried overnight at 100° C.

CONTROL 3

A Merquat ® 100 and silicone oil treated cyan toner containing 326 grams of Piccolastic ® D-125, having a softening point of 125° C. and a number average molecular weight of 1511 and a weight average molecular weight of 52,235, was prepared according to the procedure described in Example 1.

CONTROL 4

The following ingredients were used to prepare a yellow toner:

| Ingredient | Amount (g) |
|---|---|
| Dalamar ® Yellow YT-858-D (Heubach Co., Newark, NJ) | 4,360.0 |
| Cellulose Acetate | 6,538.0 |
| Acetone | 27,669.6 |
| Water | 22,680.6 |

The toner was prepared according to the procedure described in Control 1 with the exception that the milling time was 4 hours. The toner was dried and pulverized. 200 grams of the untreated yellow toner, 60 grams of 20% solution of Merquat ® 100, and 20 grams of Dow Corning 200 fluid were combined according to the procedure described in Example 1A.

CONTROL 5

326 Grams of poly(styrene-co-allyl alcohol) (Monsanto RJ-100 ®, Monsanto Co., St. Louis, Mo.), number average molecular weight of 1600 and softening point of 105° C. was used to prepare a toner according to the procedure described in Example 7 below.

CONTROL 6

The toner prepared in Control 5 was treated with Merquat ® 100 and Dow Corning 200 fluid according to the procedure described in Example 1A. Results for positiveworking and negative-working elements are shown in Tables 9 and 10, respectively.

CONTROL 7

326 Grams of poly(styrene-co-allyl alcohol) (Monsanto RJ ® 101, Monsanto Co., St. Louis, Mo.), number average molecular weight of 1150 and softening point of 100° C. was used to prepare a toner according to the procedure described in Example 7 below.

CONTROL 8

The toner prepared in Control 7 was treated with Merquat ® 100 and Dow Corning 200 fluid according to the procedure described in Example 1A. Results for positive-working and negative-working elements are shown in Tables 9 and 10, respectively.

PREPARATIONS OF CYAN TONER

Preparation of a Cyan/Poly(alpha-methylstyrene). MW 790

A cyan toner containing a cyan pigment and poly(alpha-methylstyrene), M.W. 790 (Amoco Resin 18-240, Amoco Chemical Co., Chicago, Ill.), was prepared according to the following procedure:

72 grams of Heliogen ® Blue K 7090 (BASF Corp., Holland, Mich. 49423) and 326 grams of poly(alphamethylstyrene), number average molecular weight (790) were placed in a 2 quart Bain Marie container (LeBeau Products, Baraboo, Wis. 53913. An 8 inch (20.3 cm) stainless steel chain was added and the mixture was shaken on a Paint Conditioner, Model MKI-R (Red Devil, Inc., Union, N.J. 07083) for 30 minutes.

This mixture was added slowly to a 2 roll rubber mill at 100°-110° so that a molten continous band was formed. The mill had 8 inch (20.3 cm) diameter rolls, 12 inches (30.48 cm) wide. (William Thropp & Sons, Salem, Ohio 44460). The mixture was cut by a doctor blade and returned repeatedly to the mill to reband for 20 minutes so as to maximize lateral mixing. The dispersion was left on the rotating rolls for another 20 minutes. After removal from the rolls, it was cooled and broken up into 1-3 inch (2.54-7.62 cm) chips which were sufficiently small to be fed to a hammer mill.

The chips were fed to a Reitz mill to produce a course powder. This was fed to an 8 inch (20.3 cm) jet mill (Jet Pulverizer Co., Palmyra, N.J.) at 50 grams per minute. Particle size was obtained on a Coulter Counter Model TAII (Coulter Electronics, Inc., Hialeah, Fla.) with a 30 micron aperture. Population average was 0.85 microns. Volume average was 1.9 microns.

EXAMPLE 1A

Example 1A was prepared by treating the toner obtained in Example 1 (with Merquat ® 100 (Calgon Corp., Teterboro, N.J.) according to the following procedure:

200 grams of Example 1, 75 grams of a 20% aqueous solution of Merquat ® 100 (Calgon Corp., Teterboro, N.J.), and an 8 inch (20.3 cm) stainless steel chain were placed successively in a 2 quart Bain Marie container. The mixture was shaken for 30 minutes on a Paint Conditioner, Model MKI-R. 16 grams Dow Corning 200 fluid, 100cs.(Dow Corning Corp., Midland, Mich.) were added to the mixture. The mixture was again shaken for 30 minutes and air dried for no less than 16 hours at 20°-25° C. It was then vacuum dried for at least 16 hours under a 25 inch (63.5 cm) vacuum at 20°-25° C.

EXAMPLE 1B

Example 1B was prepared by treating the toner obtained in Example 1 with Fluorad ® FC-171 (3M Co., St. Paul, Minn. 55144) according to the following procedure:

200 grams of toner Example 1 prepared as described above, 20 grams of Fluorad ® FC-171 (3M Co., St. Paul, Minn.), 5 grams Dow Corning 200 fluid, 100cs. (Dow Corning Corp., Midland, Mich.) and an 8 inch (20.3 cm) stainless steel chain were successively placed in a 2quart Bain Marie. The mixture was shaken for 30 minutes on a Red Devil #30, 5400 Paint Conditioner, Model MKI-R (Red Devil, Inc., Union, N.J.).

EXAMPLE 1C

Example 1C was prepared by treating the toner obtained in Example 1 with Varstat ® 66 (Sherex Chemical Co., Dublin, Ohio 43017) according to the procedure described in Example 1B.

EXAMPLE 1D

Example 1D was prepared by treating the toner obtained in Example 1 with 20 grams of Silwet ® L-7500 (Union Carbide, Danbury, Conn. 06817) according to the procedure described in Example 1B.

EXAMPLE 1E

Example 1E was prepared by treating the toner obtained in Example 1 with 20 grams of Silwet ® L-722 (Union Carbide, Danbury, Conn. 06817) according to the procedure described in Example 1B.

EXAMPLE 1F

Example 1F was prepared by treating the toner obtained in Example 1 with 20 grams of Silwet ® L-7602 (Union Carbide, Danbury, Conn. 06817) according to the procedure described in Example 1B.

The moisture content of Control 1, Control 2, Control 7, Example 1, Example 1A, Example 1B, Example 1C, and Example 1D was obtained according to the procedure described above.

TABLE 2
WATER CONTENT OF CYAN TONERS

| Toner | Initial Water Content. % | Water Content After 90% R. H.. % | Δ* |
|---|---|---|---|
| Control 1 | 1.7 | 8.3 | 6.6 |
| Control 2 | 2.1 | 12.9 | 10.8 |
| Control 7 | 2.4 | 6.1 | 3.7 |
| Example 1 | 0.0 | 0.0 | 0.0 |
| Example 1A | 1.2 | 4.8 | 3.6 |
| Example 1B | 0.1 | 0.0 | −0.1 |
| Example 1C | 0.5 | 1.7 | 1.2 |
| Example 1D | 0.0 | 0.2 | 0.2 |

*Δ = Water Content After 90% R. H. minus Initial Water Content.

Control 1, Control 2 and Control 7 absorbed 6.6%, 10.8% and 3.7%, respectively, more water than Example 1 under the same conditions. Example 1 was an untreated cyan toner containing poly(alpha-methylstyrene) resin, M.W. 790. The comparison shows that the resins used to make the toners of this invention are humidity resistant. All three control toners absorbed more than 0.5% water under the conditions discussed above.

Examples 1 and 1A–1D all contained poly(alphamethylstyrene), M.W. 790. In the case of Examples 1A and 1C, the water content is higher because Examples 1A and 1C were not treated with the preferred antistatic agents. Control 2 and Example 1A were treated with a polymeric cationic antistatic agent (Merquat ®) and Example 1C was treated with a monomeric cationic antistatic agent (Varstat ® 66). The antistatic agents used to treat Control 2 and Examples 1A and 1C are not preferred because they are hygroscopic. Toners treated with the preferred antistatic agents absorbed little or no water as evidenced by the data presented in Table 2 for toner Examples 1B and 1D, which were treated with nonionic antistatic agents having nonpolar chains at one end and polyoxyalkylene groups at the other end. Less than 0.5% water was absorbed by Examples 1B and 1D.

The effect of the absorbed water changes the optical density response when compared to the optical density response obtained using a dry toner. In the case of cellulose acetate based toners, the absorbed water decreases the lipophilicity of the toner which impairs the ability of negative-working elements to properly wet the toner. The toned optical density becomes dependent on the relative humidity of the surrounding environment in which toning takes place. The toners described in Control 1 and Control 2 were incapable of producing a stable reproducible toning response. The toners of this invention allow a stable toned density response to be achieved at any time of the year regardless of the prevailing humidity conditions. In addition, none of the other desired image characteristics were impaired. Indeed, color purity was improved and high resolution images were obtained as is shown below.

Color values were determined according to the following procedure:

The samples to be tested were applied to a positive-working photosensitive element by means of an automatic toning apparatus as described in Tobias, U.S. Pat. No. 4,069,791, the teaching of which is hereby incorporated by reference. The positive-working element used was similar to that described in Example 1 of Applicant's assignee's, E. I. du Pont de Nemours and Company's, U.S. Pat. No. 4,356,253. To obtain equilibrium conditions rapidly, the toning pad was first saturated with the sample by applying it across the width of the toning pad and pressing the pad with a 1 inch (2.54 cm) wide spatula. Color values were measured on an ACS Spectrosensor (Applied Color Systems, Princeton, N.J.) according to the procedures described in pages 306–308, M. Bruno, Principles of Color Proofing, GAMA Communication, Dalem, N.H. Calculations were made using the equations set forth on page 63 under the discussion of 1976 CIE L*A*B* (CIELAB system) in F. W. Billmeyer and M. Saltzman, "Principles of Color Technology", 2nd edition, 1981.

Optical density is a measure of the tinctorial strength or quantity of color. Therefore, it is advantageous to maximize this number. Since a proof is a simulation of the press printing process, sufficient optical density must be available to match the print job. Although this number is expressed in single digits with 2 decimal places, improvements in the second decimal place are significant and can make the difference between a usable and nonusable toner. Decimal values are often described as "density points". For example, 0.05 density units is 5 density points. One of the advantages in using the toners of this invention is that higher toned optical densities can be obtained without degrading color purity or losing image resolution. Indeed, color purity is actually improved.

Density increases are especially difficult to accomplish without accompanying loss of color purity. Percent grayness is the inverse of color purity. Therefore, it is advantageous to minimize this number. In four color proofing, most of the spectra of color are obtained by combinations of primary colors. The color purity of the primary toner colors impacts the color purity of the mixture of colors obtained by overlaying the four colored layers. It is easy to increase grayness by the addition of black toner, but it is very difficult, if not impossible, to decrease grayness. The toners of this invention allow large decreases in percent grayness to be obtained easily without having a negative effect on the other desired properties.

Hue error is a measure of the hue or dominant wavelength (see Bruno, pp. 306–308). It is advantageous to match the color of the toner which is being replaced. Differences in color can be adjusted by addition of small amounts of appropriate toner. For example, a cyan toner that has a slightly higher hue error than a second toner can be matched by incorporating a small amount of green toner.

The samples were also applied to a negative-working element similar to that described in Example 1 of Applicant's Assignee's (E. I. du Pont de Nemours and Company's) U.S. Pat. No. 4,565,773 issued January 21, 1986, as described above.

Color measurements for positive-working elements are presented in Tables 3, 3A, 5, 7, and 9.

Color measurements for negative-working elements are presented in Tables 4, 4A, 6, 8, and 10.

TABLE 3

| | Positive-Working Element | | | | | |
|---|---|---|---|---|---|---|
| Toner | L* | A* | B* | Optical Density | Hue Error | % Grayness |
| Control 2 | 46.1 | −31.3 | −59.5 | 1.60 | 24.5 | 17.1 |
| Control 3 | 45.5 | −31.6 | −62.9 | 1.70 | 23.7 | 14.9 |
| Example 1A | 42.8 | −30.9 | −65.0 | 1.95 | 22.3 | 14.1 |

TABLE 4

| | Negative-Working Element | | | | | |
|---|---|---|---|---|---|---|
| Toner | L* | A* | B* | Optical Density | Hue Error | % Grayness |
| Control 2 | 49.6 | −31.7 | −54.3 | 1.36 | 25.5 | 19.4 |
| Control 3 | 45.7 | −28.2 | −58.8 | 1.49 | 27.4 | 18.9 |
| Example 1A | 45.1 | −29.9 | −60.2 | 1.60 | 25.6 | 17.6 |

It is advantageous to match the color of the existing material (Control 1). Control 3, while showing some improvement over Control 2, exhibited only 50% of the optical density gain when compared to Example 1A. The grayness reduction in Control 3 was minimal, especially in the negative-working element.

Microtrac ® particle sizes in microns for Controls 2 and 3 and Example 1A are as follows:

| | 10% | 50% | 90% | 10–90% Range |
|---|---|---|---|---|
| Control 2 | 1.12 | 3.11 | 7.01 | 6.88 |
| Control 3 | 1.09 | 3.50 | 6.50 | 5.41 |
| Example 1A | 0.75 | 2.10 | 4.25 | 3.50 |

The average particle size of Example 1A was 3.50 microns. The small size of Example 1A particles helped to contribute to achieving a higher optical density. The average particle size of the controls was greater than 5 microns and was a 50% increase over Example 1A. This was highly significant.

Control 2 was a toner containing cellulose acetate having a number average molecular weight above 10,000. Control 3 was a toner containing Piccolastic ® D-125 having a number average molecular weight of 1,511, and a weight average molecular weight of 52,235. The high molecular weight fractions in the latter resin contributed elasticity which interfered with the particle size reduction process.

One of the advantages of the toners of this invention is the small particle size obtained which is evidenced by the narrow 10-90% range (mostly 1.8–3.5 micron spread). Thus, high optical densities were obtained.

TABLE 3A

| | Positive-Working Element | | | | | |
|---|---|---|---|---|---|---|
| Toner | L* | A* | B* | Optical Density | Hue Error | % Grayness |
| Control 2 | 52.2 | −32.7 | −54.9 | 1.28 | 25.6 | 17.8 |
| Example 1B | 43.2 | −31.0 | −65.2 | 1.94 | 22.1 | 13.8 |
| Example 1D | 41.3 | −29.0 | −66.6 | 2.11 | 21.4 | 13.5 |

TABLE 4A

| | Negative-Working Element | | | | | |
|---|---|---|---|---|---|---|
| Toner | L* | A* | B* | Optical Density | Hue Error | % Grayness |
| Control 2 | 52.4 | −31.9 | −52.3 | 1.23 | 26.1 | 19.6 |
| Example 1B | 46.4 | −31.1 | −59.1 | 1.54 | 25.4 | 17.6 |
| Example 1D | 46.2 | −30.8 | −58.8 | 1.53 | 25.5 | 18.0 |

Examples 1B and 1D had higher optical densities and lower percent grayness figures.

EXAMPLE 2

A cyan toner containing cyan and poly(alphamethylstyrene), M.W. 960 (Amoco Resin 18-290, Amoco Chemical Co., Chicago, Ill.) was prepared according to the procedure described in Example 1. Particle size was determined as described in Example 1. Microtrac ® particle sizes in microns are presented for the toners described in Examples 1 and 2.

| | 10% | 50% | 90% | 10–90% Range |
|---|---|---|---|---|
| Example 1 | 0.75 | 2.10 | 4.25 | 3.50 |
| Example 2 | 0.78 | 2.18 | 4.21 | 3.43 |

The two samples were similar in particle size and both had 90 percentiles under 5 microns.

Example 2A was prepared by treating 200 grams of Example 2 with Merquat ® 100 and Dow Corning 200 fluid according to the procedure described in Example 1A.

The cyan toner Examples 1A and 2A and Control 2 were then applied to a positive-working and negative-working photosensitive elements and color values determined as described above. Results are presented in Tables 5 and 6 respectively.

TABLE 5

| | Positive-Working Element | | | | | |
|---|---|---|---|---|---|---|
| Toner | L* | A* | B* | Density | Error | % Grayness |
| Control 2 | 43.2 | −29.8 | −63.0 | 1.82 | 23.5 | 15.7 |
| Example 1A | 37.9 | −23.1 | −68.2 | 2.22 | 23.0 | 14.3 |
| Example 2A | 39.2 | −25.6 | −66.6 | 2.14 | 22.7 | 14.6 |

TABLE 6

| | Negative-Working Element | | | | | |
|---|---|---|---|---|---|---|
| Toner | L* | A* | B* | Optical Density | Hue Error | % Grayness |
| Control 2 | 49.5 | −31.8 | −55.3 | 1.38 | 25.5 | 18.7 |
| Example 1A | 43.3 | −28.7 | −62.2 | 1.72 | 25.1 | 16.8 |
| Example 2A | 43.6 | −28.8 | −61.5 | 1.69 | 25.4 | 17.2 |

Examples 1A and 2A showed dramatic increases in optical density and decrease in percent grayness on both photopolymer elements. This is a reflection of the particle size range.

EXAMPLE 3

A yellow toner containing a monoarylide yellow pigment and poly(alpha-methylstyrene) M.W. 790, was prepared by mixing 240 grams of Dalamar ® Yellow, YT-858-D (Heubach Co., Newark, N.J.) and 360 grams of Amoco Resin 18-240 according to the procedure described in Example 1. Particle sizes were obtained on a Microtrac ® Particle Analyzer (Leeds and Northrup Instruments, North Wales, Pa.).

|  | 10% | 50% | 90% | 10-90% Range |
|---|---|---|---|---|
| Example 3 | 0.59 | 1.97 | 4.26 | 3.67 |
| Control 4 | 0.85 | 2.63 | 6.46 | 5.61 |

While the average particle sizes were closer than in the cyan toners, the 90th percentile showed a larger "oversize" fraction which is reflected in the broader range. These large particles decrease the efficiency of toning.

EXAMPLE 3A

Example 3A was prepared by treating 200 grams of Example 3 with 60 grams of Merquat ® 100 and Dow Corning 200 fluid according to the procedure in Example 1A.

Toner Example 3A and Control 4 were applied to positive-working and negative-working photopolymerizable elements similar to those described above and color values were obtained as described above. Results for the positive-working and negative-working elements are shown in Tables 7 and 8, respectively.

TABLE 7

| | Positive-Working Element | | | | | |
|---|---|---|---|---|---|---|
| Toner | L* | A* | B* | Optical Density | Hue Error | % Grayness |
| Control 4 | 91.8 | −2.76 | 105.8 | 1.23 | 6.19 | 4.07 |
| Example 3A | 91.1 | −0.40 | 108.1 | 1.30 | 7.27 | 3.80 |

TABLE 8

| | Negative-Working Element | | | | | |
|---|---|---|---|---|---|---|
| Toner | L* | A* | B* | Optical Density | Hue Error | % Grayness |
| Control 4 | 90.6 | −3.14 | 101.3 | 1.18 | 6.23 | 5.51 |
| Example 3A | 90.0 | −0.53 | 104.8 | 1.27 | 7.33 | 5.20 |

The optical densities were higher for Example 3A and the percent grayness was lower. It is especially difficult to increase the optical densities of yellow toners by adding more yellow pigment because this causes the percent grayness to increase. The seven to nine density point advantage which Example 3A exhibits over Control 4 is a useful property for extending the color gamut of proofing elements.

EXAMPLE 4

A red toner was prepared by mixing 240 grams of poly(alpha-methylstyrene), number average molecular weight, 790 (Amoco Resin 18-240) and 160 grams of Indofast ® Brilliant Scarlet R-6300 (Mobay Corp., Pittsburgh, Pa.) according to the procedure described in Example 1. Particle size was determined using the Microtrac ® Particle Analyzer (Leeds and Northrup Instruments, North Wales, Pa. 19454).

|  | 10% | 50% | 90% | 10-90% Range |
|---|---|---|---|---|
| Example 4 | 0.56 | 1.77 | 3.90 | 3.34 |

EXAMPLE 5

A reddish-blue toner was prepared by mixing 280 grams of poly(alpha-methylstyrene), number average molecular weight, 790 (Amoco Resin 18-240) and 120 grams of Paliogen ® Blue K 6470 (BASF Corp., Holland, Mich. 49423) according to the procedure described in Example 1. Particle size was determined using the Microtrac ® Particle Analyzer (Leeds and Northrup Instruments, North Wales, Pa. 19454).

|  | 10% | 50% | 90% | 10-90% Range |
|---|---|---|---|---|
| Example 5 | 0.72 | 2.09 | 4.62 | 3.90 |

EXAMPLE 6

A yellowish green toner was prepared by mixing 160 grams of Paliogen ® Green K 9360 (BASF Corp., Holland, Mich. 49423) with 240 grams of poly(alpha-methylstyrene), M.W., 790 (Amoco Resin 18-240) according to the procedure described in Example 4. Particle size was determined using the Microtrac ® Particle Analyzer (Leeds and Northrup Instruments, North Wales, Pa. 19454).

|  | 10% | 50% | 90% | 10-90% Range |
|---|---|---|---|---|
| Example 6 | 0.69 | 1.70 | 3.49 | 2.80 |

Examples 4, 5, and 6 gave 90% values below 5.0 microns. Examples 4 and 6 gave especially small particle sizes. Example 6 had the lowest particle size range of all toners described herein.

EXAMPLE 7

326 grams of poly(alpha-methylstyrene) (number average molecular weight of 685 (Amoco Resin 18-210) and softening point of 93°-104° C.) was mixed using the pigment and procedure described in Example 1. Particle size was determined as in Example 1. Example 7 had a population average of 1.0 microns and a volume average of 2.3 microns as determined on a Coulter Counter.

EXAMPLE 7A

The toner described in Example 7 was treated with Merquat ® 100 and Dow Corning 200 fluid according to the procedure described in Example 1. Results for positive-working and negative-working elements are shown in Tables 9 and 10, respectively.

TABLE 9

| | Positive-Working Element | | | | | |
|---|---|---|---|---|---|---|
| Toner | L* | A* | B* | Optical Density | Hue Error | % Grayness |
| Control 1 | 43.2 | −29.8 | −63.0 | 1.82 | 23.5 | 15.7 |
| Control 6 | 40.0 | −28.8 | −65.0 | 1.96 | 22.9 | 14.8 |
| Control 8 | 38.7 | −25.1 | −66.6 | 2.15 | 22.9 | 15.0 |
| Example 7A | 39.3 | −26.2 | −66.4 | 2.14 | 22.5 | 14.6 |

TABLE 10

| | Negative-Working Element | | | | | |
|---|---|---|---|---|---|---|
| Toner | L* | A* | B* | Optical Density | Hue Error | % Grayness |
| Control 1 | 49.5 | −31.8 | −55.3 | 1.38 | 25.5 | 18.7 |
| Control 6 | 47.0 | −32.3 | −58.5 | 1.57 | 24.0 | 17.9 |
| Control 8 | 47.0 | −31.9 | −58.1 | 1.54 | 24.4 | 15.6 |
| Example 7A | 47.6 | −30.4 | −59.2 | 1.45 | 26.6 | 17.4 |

Example 7A showed desired optical density improvements along with improvements in color purity. Controls 6 and 8 showed acceptable gains in optical density and color purity. However, they contained resins which were not humidity resistant. See data for Control 7 in Table 2.

What is claimed is:

1. In a method for color development of a surface having imagewise tacky and nontacky image areas which comprises (a) applying a dry nonelectroscopic toner to the image-bearing surface;

(b) distributing the toner particles over the image surface whereby the distributed toner particles become embedded solely in the tacky image areas; and (c) physically removing toner particles from the nontacky areas which are left substantially free of the toner particles, the improvement wherein images having higher toned optical density with improved color purity are obtained using a dry nonelectroscopic humidity resistant toner having a size distribution within the range from about 0.2 micron to about 10 microns, not more than 10% of the toner being below about 0.5 micron and not more than 10% of the toner being above 5 microns, and the toner consists essentially of a colorant dispersed in an organic resin wherein the resin is a single homogeneous polymer selected from the group consisting of homopolymers of styrene or styrene homologs, and interpolymers thereof, said polymer having a number average molecular weight in the range from about 500 to about 2,000, and said polymer having a softening temperature in the range from about 75° C. to about 175° C.

2. A process according to claim 1 wherein a surprint multicolor proof is formed by laminating at least one other tonable photoimagable layer over the previously imagewise toned layer, each tonable photoimagable layer being exposed through a different color separation transparency and the respective layer having been colored with toners in a spectral region corresponding to the color separation transparency used for exposure.

3. A process according to claim 1 wherein a humidity resistant antistatic agent is applied to the toner surface.

4. A process according to claim 1 wherein the number average molecular weight of the polymer is in the range from about 600 to about 1000.

5. A process according to claim 1 wherein the polymer is a linear homopolymer of alphamethylstyrene having a number average molecular weight in the range from about 600 to about 1000 and a softening temperature in the range from about 90° C. to about 150° C.

6. A process according to claim 3 wherein the antistatic agent is a nonionic block copolymer compound which is liquid above 10° C., present as a single phase, and having a viscosity of less than 1000 cps and a hydrophilelipophile balance in the range of 7 to 15 taken from the group consisting of (a) a mixture of block copolymers wherein each copolymer contains a siloxane polymer and at least one oxyalkylene polymer in combination, the siloxane polymer being composed of at least one trifunctional silicon atom, bonded to three oxygen atoms and a single monovalent hydrocarbon radical, and joined to at least three difunctional silicon atoms through oxysilicon bonds, each of said difunctional silicon atoms having two monovalent hydrocarbon radicals bonded thereto and the oxyalkylene polymer being composed of at least two oxyalkylene groups bonded to each other by oxycarbon bonds and bonded at one end to the siloxane polymer through a carbon-oxy-silicon bond and bonded at the other end to a monoether radical, (b) a block copolymer composed of (1) at least one siloxane unit represented by the formula:

wherein R contains from one to abOut twenty-twO carbon atoms inclusive and is selected from the class consisting of monovalent hydrocarbon groups and divalent hydrocarbon groups and b has a value from 1 to 3 inclusive, said siloxane block containing at least one of said siloxane units wherein at least one R group is a divalent hydrocarbon group, and (2) at least one oxyalkylene block containing at least two oxyalkylene groups represented by the formula: —R′O—, wherein R′ is an alkylene group containing from two to about ten carbon atoms inclusive, said siloxane and oxyalkylene blocks being interconnected by said divalent hydrocarbon group, and (c) mixtures of said block copolymers.

7. A process according to claim 3 wherein the antistatic agent is an organofunctional substituted fluorocarbon compound having a boiling point under normal atmospheric conditions greater than 300° F, and (1) having a general formula R(f)QA wherein R(f) is a perfluoroalkyl group, $C_nF_{(2n+1)}$, where N is from 4 to 20; Q is a divalent bridging group capable of connecting the R(f) group with the A group, Q being an alkylene/oxy group, $(-CH_1-)_xO-$, or an alkylene group, $(-CH_2-)_x$, where x is from 2 to 6; a sulfonamido group, $-SO_2N(R_1)-$; or a sulfonamido/alkylene group, $-SO_2N(R_1)(CH_2)_x-$, where $R_1$ is $C_1$ to $C_6$ alkyl and x is from 2 to 6; and A is the terminal group, A being H when Q is sulfonamido; $-(R_2O)_mR_3$ where $R_2$ is an alkylene group of 2 to 6 carbons or mixtures thereof, and $R_3$ is H or $C_1$ to $C_4$ alkyl, and m is 1 to 22; or A is an acrylate group, $OOCC(R_4)=CH_2$, where $R_4$ is H, $-CH_3$, or $-C_2H_5$; or (2) being a fluoroaliphatic polymeric ester.

8. A dry nonelectroscopic, humidity resistant toner for producing images having higher toned optical density with improved color purity, said toner having a size distribution within the range from about 0.2 micron to about 10 microns, and not more than 10% of the toner being below about 0.5 micron and not more than 10% of the toner being above 5 microns, and which comprises a colorant dispersed in an organic resin wherein the resin is a single homogeneous polymer selected from the group consisting of homopolymers of styrene or styrene homologs, and interpolymers thereof, said polymer having a number average molecular weight in the range from about 500 to about 2,000, and said polymer having a softening temperature in the range from about 75° C. to about 175° C.

9. A toner according to claim 8 wherein the number average molecular weight of the polymer is in the range from about 600 to about 1,000.

10. A toner according to claim 8 wherein the polymer is a linear homopolymer of alphamethylstyrene having a number average molecular weight in the range from about 600 to about 1,000 and a softening temperature in the range from about 90° C. to about 150° C.

11. A toner according to claim 8 or claim 10 wherein a slip agent is applied to the surface thereof.

12. A toner according to claim 8, claim 10 or claim 11 wherein a humidity resistant antistatic agent is applied to the surface thereof.

13. A toner according to claim 12 wherein the antistatic agent is a nonionic block copolymer compound which is liquid above 10° C., present as a single phase, and having a viscosity of less than 1000 cps and a hydrophilelipophile balance in the range of 7 to 15 taken from the group consisting of
   (a) a mixture of block copolymers wherein each copolymer contains a siloxane polymer and at least one oxyalkylene polymer in combination, the siloxane polymer being composed of at least one trifunctional silicon atom, bonded to three oxygen atoms and a single monovalent hydrocarbon radical, and joined to at least three difunctional silicon atoms through oxysilicon bonds, each of said difunctional silicon atoms having two monovalent hydrocarbon radicals bonded thereto and the oxyalkylene polymer being composed of at least two oxyalkylene groups bonded to each other by oxycarbon bonds and bonded at one end to the siloxane polymer through a carbon-oxy-silicon bond and bonded at the other end to a monoether radical,
   (b) a block copolymer composed of (1) at least one siloxane unit represented by the formula:

$$R_b SiO_{4-b/2}$$

wherein R contains from one to about twenty-two carbon atoms inclusive and is selected from the class consisting of monovalent hydrocarbon groups and divalent hydrocarbon groups and b has a value from 1 to 3 inclusive, said siloxane block containing at least one of said siloxane units wherein at least one R group is a divalent hydrocarbon group, and (2) at least one oxyalkylene block containing at least two oxyalkylene groups represented by the formula: —R'O—, wherein R' is an alkylene group containing from two to about ten carbon atoms inclusive, said siloxane and oxyalkylene blocks being interconnected by said divalent hydrocarbon group, and
   (c) mixtures of said block copolymers.

14. A toner according to claim 12 wherein the antistatic agent is an organofunctional substituted fluorocarbon compound having a boiling point under normal atmospheric conditions greater than 300° F., and
   (1) having a general formula R(f)QA wherein R(f) is a perfluoroalkyl group, $C_n F_{(2n+1)}$, where N is from 4 to 20; Q is a divalent bridging group capable of connecting the R(f) group with the A group, Q being an alkylene/oxy group, $(-CH_1)_x O-$, or an alkylene group, $(-CH_2)_x$, where x is from 2 to 6; a sulfonamido group, $-SO_2 N(R_1)-$; or a sulfonamido/alkylene group, $SO_2 N(R_1)(CH_2)_x-$, where $R_1$ is $C_1$ alkyl and x is from 2 to 6; and A is the terminal group, A being H when Q is sulfonamido; $-(R_2 O)_m R_3$ where $R_2$ is an alkylene group of 2 to 6 carbons or mixtures thereof, and $R_3$ is H or $C_1$ to $C_4$ alkyl, and m is 1 to 22; or A is an acrylate group, $OOCC(R_4)=CH_2$, where $R_4$ is H, $-CH_3$, or $-C_2 H_5$; or
   (2) being a fluoroaliphatic polymeric ester.

15. A process according to claim 1, 3, or 5 wherein a slip agent is applied to the toner surface.

* * * * *